United States Patent [19]
Greenberg

[11] Patent Number: 5,546,024
[45] Date of Patent: Aug. 13, 1996

[54] DYNAMIC NOR DECODER USING CURRENT MODE SENSING TECHNIQUES

[75] Inventor: Craig B. Greenberg, Rowlett, Tex.

[73] Assignee: Texas Instruments Incorporated, Dallas, Tex.

[21] Appl. No.: 475,453

[22] Filed: Jun. 7, 1995

[51] Int. Cl.⁶ .................. H03K 19/084; H03K 19/096
[52] U.S. Cl. .................. 326/106; 326/98; 326/108
[58] Field of Search .................. 326/105, 106, 326/108, 98

[56] References Cited

U.S. PATENT DOCUMENTS

| | | | |
|---|---|---|---|
| 4,796,230 | 1/1989 | Young | 326/106 |
| 5,291,076 | 3/1994 | Bridges et al. | 326/106 |
| 5,373,203 | 12/1994 | Nicholes et al. | 326/106 |

Primary Examiner—Edward P. Westin
Assistant Examiner—Richard Roseen
Attorney, Agent, or Firm—Alan K. Stewart; Richard L. Donaldson; William E. Hiller

[57] ABSTRACT

A NOR decode circuit which includes a latch composed of a pair of n-channel transistors and a pair of p-channel transistors with the p-channel transistor of one latch portion coupled to a reference circuit transistor via a first pass transistor and the p-channel transistor of the other latch portion coupled to the address select line controlled transistors via a second pass transistor. The pass transistors are also controlled by an enable row (ENROW) signal. The address transistors are larger and conduct more current than the reference transistor. When ENROW is activated, the n-channel transistors of the latch are enabled and current passes through one side of the latch circuit and through a third transistor in parallel with the address transistors if any of the address transistors are turned on. Current also flows through the other side of the latch circuit and through a fourth transistor in parallel with the reference transistor. The second pass transistor conducts a current $I_1$ plus the current through the reference transistor ($I_{ref}$) and the first pass transistor conducts a current $I_1$ plus the current through an address transistor ($nI_{ref}$). Therefore, the second pass transistor conducts a current $I_1+I_{ref}$ and the first pass transistor conducts a current $I_1+nI_{ref}$. The difference between these currents, i.e. $(n-1)I_{ref}$, is amplified by the latch, causing the row line to remain low when an address transistor is selected and causing the row line to be high when none of the address transistors is selected.

20 Claims, 1 Drawing Sheet

DYNAMIC NOR DECODER USING CURRENT MODE SENSING TECHNIQUES

BACKGROUND OF THE INVENTION

1. Field of the Invention

This invention relates to NOR circuits in general and, more specifically, to a dynamic NOR decoder using current mode sensing techniques.

2. Brief Description of the Prior Art

Standard prior art dynamic NOR circuits are generally used in decoders or circuits with high fan-in NOR logic. This decode scheme has an advantage over its static NOR circuit counterpart because high fan-in can be obtained with good performance. However, there are two principal disadvantages present in prior art dynamic NOR circuitry. The first disadvantage is that these circuits display high power dissipation. This is due to the logic of the NOR function itself whereby all row decoders are charged and then all are discharged except the decoder for the one row being activated. This causes the decode (DEC) node for all decode lines not selected to be discharged to ground after having previously been charged prior to the selection being made. The decode (DEC) nodes can be highly capacitive, depending upon the size (fan-in) of the decoder circuit elements. This high node capacitance must be precharged by the power supply before the next cycle of operation, the precharging power consumption often being significant. The result of such node capacitance (stray capacitance) is excessive power drain as well as slowing of circuit operation. The second disadvantage is a race condition for which there must be compensation. A race exists between the enable decode (ENDEC) signal, which enables the decode portion of the circuit and the enable driver (ENDRV) signal, which enables the driver portion of the circuit. To insure correct operation, the ENDEC signal must become active some time earlier than the ENDRV signal because the ENDEC signal determines the signal upon which the driver circuit, controlled by the ENDRV signal, must operate. This critical timing insures that the signal at the DEC node is at the correct logic level before the row driver is enabled. If the proper timing is not met, a deselected row may glitch and provide an erroneous signal indicating selection thereof when, in fact, no such selection was made. Compensating for this race condition causes a delay in row access since the driver enabling time must be delayed to insure its operation subsequent to the decode enable operation, thereby causing the slowing down of the operation of the circuit.

SUMMARY OF THE INVENTION

To alleviate these problems and in accordance with the present invention, a current mode sense NOR decode circuit is provided which can be used in a variety of applications, however the discussion herein will be limited to memory devices as the preferred embodiment thereof. Similar to the prior art dynamic NOR circuit discussed above, the current mode sense NOR decode circuit in accordance with the present invention has two modes of operation, these being the precharge mode and the sensing mode.

The NOR decode circuit includes a latch composed of a pair of n-channel transistors and a pair of p-channel transistors with the p-channel transistor of one latch portion coupled to a reference circuit transistor via a first pass transistor and the p-channel transistor of the other latch portion coupled to the address select line controlled transistors via a second pass transistor. The pass transistors are controlled by an enable row (ENROW) signal. The transistors coupled to the address select lines are larger and conduct more current than the reference transistor. When ENROW is not activated, the n-channel pass transistors are disabled.

When the ENROW line is activated, the n-channel transistors of the latch are enabled. Current therefore passes through one side of the latch circuit and through a third transistor in parallel with the address transistors if any of the address transistors are turned on, meaning that that row has been deselected. Current also flows through the other side of the latch circuit and through a fourth transistor in parallel with the reference transistor. The address transistors will conduct more current than the reference transistor because the address transistors are larger than the reference transistor by some multiple and the first pass transistor will conduct this additional current. The larger the ratio of current carrying capacity of the address transistors to the reference transistors, the less chance there is for a glitch. However, the larger the address transistor, the more power is required. Accordingly, a tradeoff is made with the address transistor always having a larger current carrying capacity than the reference transistor.

The second pass transistor conducts a current $I_1$ plus the current through the reference transistor ($I_{ref}$) and the first pass transistor conducts a current $I_1$ plus the current through an address transistor ($nI_{ref}$), where n is the multiplier required due to the larger current carrying capacity of the address transistors. Therefore, the second pass transistor conducts a current $I_1+I_{ref}$ and the first pass transistor conducts a current $I_1+nI_{ref}$. The difference between these currents, i.e. $(n-1)I_{ref}$ is amplified by the latch, causing the row line to remain low when an address transistor is selected and causing the row line to be high when none of the address transistors is selected.

It should be understood that the circuitry can be provided herein with all n-channel devices replace with p-channel devices and vice versa as is well known to those skilled in the art.

DESCRIPTION OF THE PREFERRED EMBODIMENT

Figure 1:
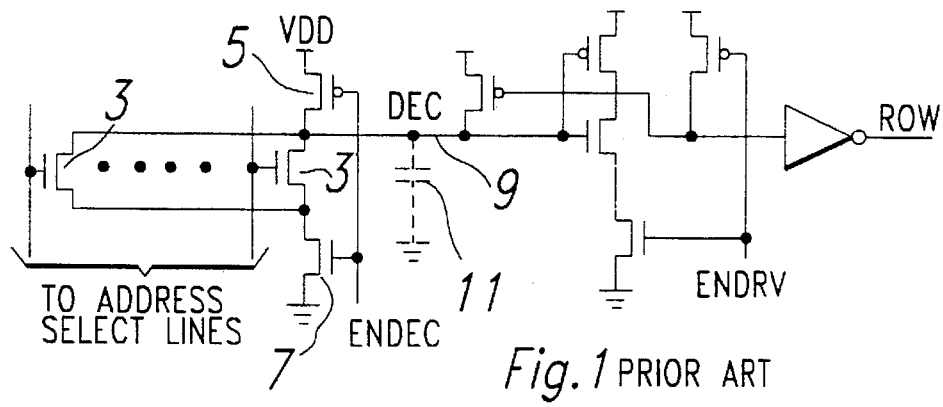
FIG. 1 is a circuit diagram of a typical prior art dynamic NOR decoder circuit.
Figure 2:
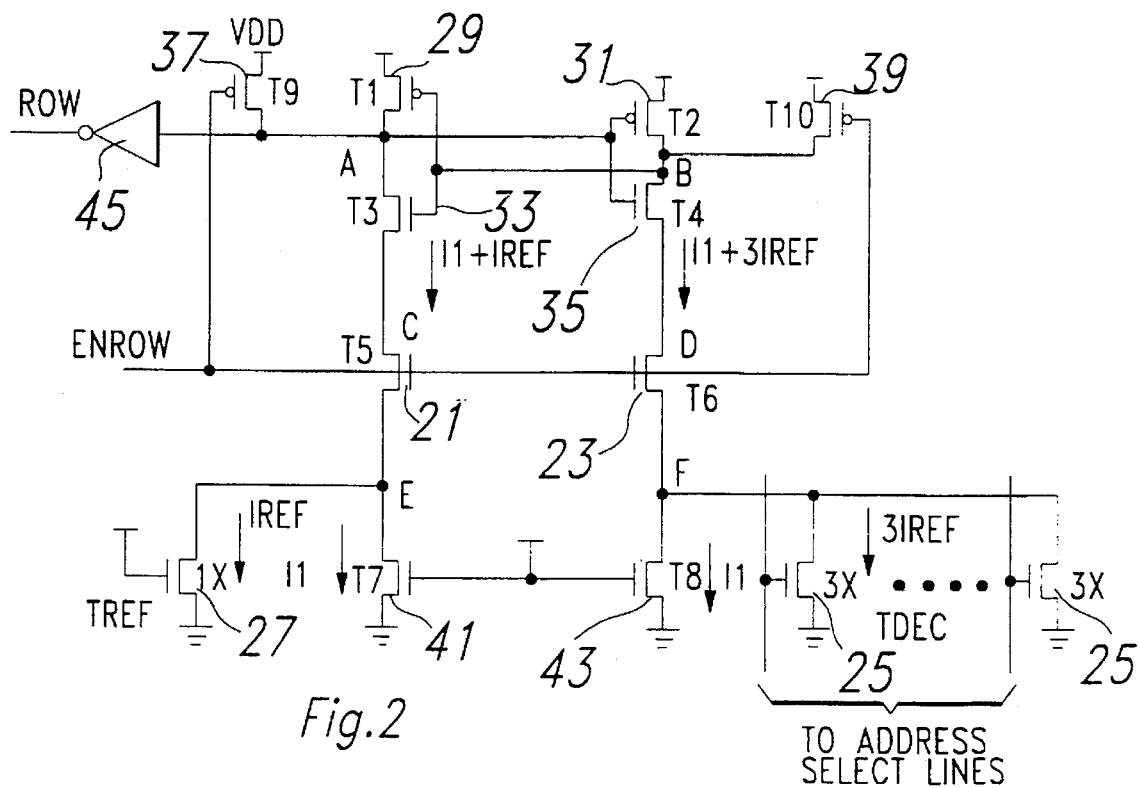
FIG. 2 is a circuit diagram of a dynamic NOR decoder using current mode sensing techniques in accordance with the present invention.

Referring first to FIG. 1, there is shown a typical prior art dynamic NOR decoder circuit for selection of a row, it being understood that the decoder circuit includes plural such rows, each row activated by a different address. The circuit includes a plurality of address select lines 1, each address select line coupled to the gate of a different transistor 3, the transistors 3 being connected in parallel. All of the transistors 3 are initially non-conducting. Therefore, when a negative signal is provided on the ENDEC line, transistor 5 will turn on and transistor 7 will turn off, thereby charging the DEC line 7 to $V_{DD}$. After the signal on the ENDEC line is turned of and after a particular row is selected from the address on the address lines 1, the DEC line 9 associated with that address will remain high whereas all non-selected DEC lines 9 will discharge, this discharge including the parasitic capacitance 11 related to each discharged row. It is apparent that, for each address selected, there will be a charge and discharge of the DEC line 9 associated with each of the non-selected rows.

In addition, there is a race between the signal on the enable decoder line (ENDEC) and the enable driver line (ENDRV) as to whether the signal on the ENDEC line will go off before the signal on the ENDRV line goes on. If this signal order does not take place, there is the possibility of a glitch on the associated row line. This problem is exacerbated by an increase in component size and/or complexity of the circuit because such increase increases the parasitic capacitance of the decode circuit and therefore slows down the operation thereof. The slowdown of circuit operation in the decode portion of the circuit provides a greater opportunity for the signal on the ENDRV line to become active prior to deactivation of the signal on the ENDEC line and cause prior operation of the drive portion of the circuit.

In accordance with the present invention, the above described problems inherent in the prior art are minimized by providing a current mode sense NOR decode circuit.

The NOR decode circuit includes a latch composed of n-channel transistors 29 and 31 and p-channel transistors 33 and 35 with transistor 33 of the latch coupled to a reference circuit transistor 27 via a pass transistor 21 and transistor 35 of the latch coupled to the address select line controlled transistors 25 via a pass transistor 23. The pass transistors 21 and 23 are controlled by an enable row (ENROW) signal. The transistors 25 are larger than transistor 27 by a predetermined factor, this number being three in the preferred embodiment. When ENROW is not activated, transistors 37 and 39 conduct and therefore prevent transistors 29 and 31 from conducting during that condition by placing a voltage $V_{DD}$ on the nodes A and B to provide an essentially zero voltage across these transistors.

When the enable row (ENROW) line is activated, transistors 37 and 39 are turned off, thereby removing $V_{DD}$ from the nodes A and B and transistors 21 and 23 are turned on. Current therefore passes through the latch circuit to nodes E and F and then through transistor 41 in parallel with transistor 27 and transistor 43 in parallel with transistors 25 if any of the address transistors 25 are turned on, meaning that that row has been deselected. Transistors 25 will conduct more current than transistor 27 because transistors 25 are larger than transistor 27 by some multiple, three in the preferred embodiment, and transistor 23 will conduct this additional current. Therefore, transistors 25 will individually conduct three times the current that the transistor 27 conducts. The transistor 21 conducts a current $I_1$ plus the current through transistor 27 ($I_{ref}$) and transistor 23 conducts a current $I_1$ plus the current through a transistor 25 ($3 I_{ref}$). Therefore transistor 21 conducts a current $I_1+I_{ref}$ and transistor 23 conducts a current $I_1+3I_{ref}$. The difference between these currents, i.e. $2I_{ref}$, is sensed at nodes E and F as voltage differences and this voltage difference is amplified by the latch composed of transistors 29, 31, 33 and 35, causing node B to continue to fall and thereby causing node A to maintain its charge due to the feedback in the latch circuit. For this case, the row line remains low due to inverter 45, as expected for a deselected row. Only if all of the transistors 25 are off will the row line become active. In this case, transistor 21 conducts $I_1+I_{ref}$ and transistor 23 will conduct only $I_1$. Once again, the difference current, $I_{ref}$ will be amplified by the latch and node A will fall and node B will maintain its charge. The row line will then go active, as expected for a selected line.

The difference currents being sensed can be modified by selecting appropriate sizes of transistors 25. Larger difference currents will ensure quicker sensing at the cost of additional power. Also, large capacitance loading differences on nodes E and F may cause improper operation. Accordingly, if this condition occurs, dummy load transistors may be added to node E at the junction of transistors 21 and 41 to match capacitances more closely. This will ensure that any current caused by the charging and discharging of the stray capacitance is equal into nodes E and F.

An advantage of the present invention is that glitching will not occur since there is no race to contend with. Also, precharge power has been limited to the lower capacitance nodes (the latch) as opposed to a possible large number of decode transistors connected in parallel. In addition, depending upon the application, by the decode itself having a built in latch, any latching necessary in the row select drivers is eliminated.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A dynamic NOR circuit comprising:
   (a) a latch circuit having a first current path and a second current path and a NOR output terminal;
   (b) an address select circuit coupled to said first current path having a first transistor of predetermined current carrying capacity and a second transistor of predetermined current carrying capacity, a control terminal of said first transistor is a first NOR input terminal, a control terminal of said second transistor is a second NOR input terminal;
   (c) a reference circuit coupled to said second current path having a third transistor of current carrying capacity less than said first transistor; and
   (d) pass circuitry for substantially simultaneously coupling said address select circuit and said reference circuit to said latch circuit in response to an enable signal.

2. The circuit of claim 1 wherein said pass circuitry comprises a switch.

3. The circuit of claim 2 wherein said switch is a transistor.

4. The circuit of claim 1 wherein said first current path comprises an n-channel transistor serially coupled to a p-channel transistor and said second current path comprises an n-channel transistor serially coupled to a p-channel transistor, the gates of said transistors of said first current path coupled together and to the junction of the transistors of said second current path and the gates of said transistors of said second current path coupled together and to the junction of the transistors of said first current path.

5. The circuit of claim 2 wherein said first current path comprises an n-channel transistor serially coupled to a p-channel transistor and said second current path comprises an n-channel transistor serially coupled to a p-channel transistor, the gates of said transistors of said first current path coupled together and to the junction of the transistors of said second current path and the gates of said transistors of said second current path coupled together and to the junction of the transistors of said first current path.

6. The circuit of claim 3 wherein said first current path comprises an n-channel transistor serially coupled to a p-channel transistor and said second current path comprises an n-channel transistor serially coupled to a p-channel transistor, the gates of said transistors of said first current path coupled together and to the junction of the transistors of said second current path and the gates of said transistors of said second current path coupled together and to the junction of the transistors of said first current path.

7. The circuit of claim 1 wherein said reference circuit comprises a fourth transistor of predetermined current carrying capacity in parallel with said third transistor and said address select circuit comprises a fifth transistor of the same current carrying capacity as said fourth transistor in parallel with said first transistor.

8. The circuit of claim 2 wherein said reference circuit comprises a fourth transistor of predetermined current carrying capacity in parallel with said third transistor and said address select circuit comprises a fifth transistor of the same current carrying capacity as said fourth transistor in parallel with said first transistor.

9. The circuit of claim 3 wherein said reference circuit comprises a fourth transistor of predetermined current carrying capacity in parallel with said third transistor and said address select circuit comprises a fifth transistor of the same current carrying capacity as said fourth transistor in parallel with said first transistor.

10. The circuit of claim 4 wherein said reference circuit comprises a fourth transistor of predetermined current carrying capacity in parallel with said third transistor and said address select circuit comprises a fifth transistor of the same current carrying capacity as said fourth transistor in parallel with said first transistor.

11. The circuit of claim 5 wherein said reference circuit comprises a fourth transistor of predetermined current carrying capacity in parallel with said third transistor and said address select circuit comprises a fifth transistor of the same current carrying capacity as said fourth transistor in parallel with said first transistor.

12. The circuit of claim 6 wherein said reference circuit comprises a fourth transistor of predetermined current carrying capacity in parallel with said third transistor and said address select circuit comprises a fifth transistor of the same current carrying capacity as said fourth transistor in parallel with said first transistor.

13. The circuit of claim 1 further including means normally disabling current flow in said first and second current paths and responsive to activation of said pass circuitry for enabling current flow in said first and second current paths.

14. The circuit of claim 2 further including means normally disabling current flow in said first and second current paths and responsive to activation of said pass circuitry for enabling current flow in said first and second current paths.

15. The circuit of claim 3 further including means normally disabling current flow in said first and second current paths and responsive to activation of said pass circuitry for enabling current flow in said first and second current paths.

16. The circuit of claim 4 further including means normally disabling current flow in said first and second current paths and responsive to activation of said pass circuitry for enabling current flow in said first and second current paths.

17. The circuit of claim 5 further including means normally disabling current flow in said first and second current paths and responsive to activation of said pass circuitry for enabling current flow in said first and second current paths.

18. The circuit of claim 6 further including means normally disabling current flow in said first and second current paths and responsive to activation of said pass circuitry for enabling current flow in said first and second current paths.

19. The circuit of claim 9 further including means normally disabling current flow in said first and second current paths and responsive to activation of said pass circuitry for enabling current flow in said first and second current paths.

20. The circuit of claim 12 further including means normally disabling current flow in said first and second current paths and responsive to activation of said pass circuitry for enabling current flow in said first and second current paths.

* * * * *